(12) United States Patent
Albert et al.

(10) Patent No.: US 7,239,268 B1
(45) Date of Patent: Jul. 3, 2007

(54) METHOD AND APPARATUS FOR MINIMIZING THE NUMBER OF POWER AMPLIFIERS REQUIRED UNDER MULTIPLE TRANSMISSION CONDITIONS

(75) Inventors: Stuart D. Albert, Bricktown, NJ (US); John F. Prorok, Neptune, NJ (US); William J. Skudera, Jr., deceased, late of Oceanport, NJ (US); by Joan Skudera, legal representative, Oceanport, NJ (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 717 days.

(21) Appl. No.: 10/235,215

(22) Filed: Sep. 5, 2002

(51) Int. Cl.
*G01S 7/28* (2006.01)
*G01S 13/00* (2006.01)

(52) U.S. Cl. ............... 342/202; 342/118; 342/134; 342/175; 342/195; 398/79; 398/80; 398/140; 398/141; 398/146; 398/173; 398/178; 398/179

(58) Field of Classification Search .......... 398/79, 398/80, 140, 141, 146, 173, 178, 179; 342/159, 342/175, 200–205, 118, 134–144, 192, 193, 342/195; 359/333, 349
See application file for complete search history.

(56) References Cited

U.S. PATENT DOCUMENTS

| 5,396,360 | A | * | 3/1995 | Majima | 359/349 |
|---|---|---|---|---|---|
| 5,495,253 | A | * | 2/1996 | Albert et al. | 342/159 |
| 5,654,816 | A | * | 8/1997 | Fishman | 359/349 |
| 6,067,179 | A | * | 5/2000 | Roberts et al. | 359/349 |
| 6,091,538 | A | * | 7/2000 | Takeda et al. | 359/349 |
| 6,810,214 | B2 | * | 10/2004 | Chbat et al. | 398/173 |
| 6,973,268 | B1 | * | 12/2005 | Thompson | 359/349 |
| 7,170,444 | B1 | * | 1/2007 | Seddon et al. | 342/202 |
| 2002/0141047 | A1 | * | 10/2002 | Vusirikala et al. | 359/349 |

* cited by examiner

*Primary Examiner*—Bernarr E. Gregory
(74) *Attorney, Agent, or Firm*—Michael Zelenka; George B. Tereschuk

(57) ABSTRACT

The number of power amplifiers required to amplify a plurality of transmission signals is reduced by using non-linear transmission lines (NTL) circuits. In general, a "combining" NTL circuit is used to combine the plurality of transmission signals to form a soliton pulse. The soliton pulse is then amplified such that each of its component transmission signals are amplified. A "dividing" NTL circuit is then used to divide the amplified soliton pulse into its component amplified transmission signals. The amplified transmission signals can therefore be transmitted over a communications channel without requiring a separate power amplifier for each.

14 Claims, 2 Drawing Sheets

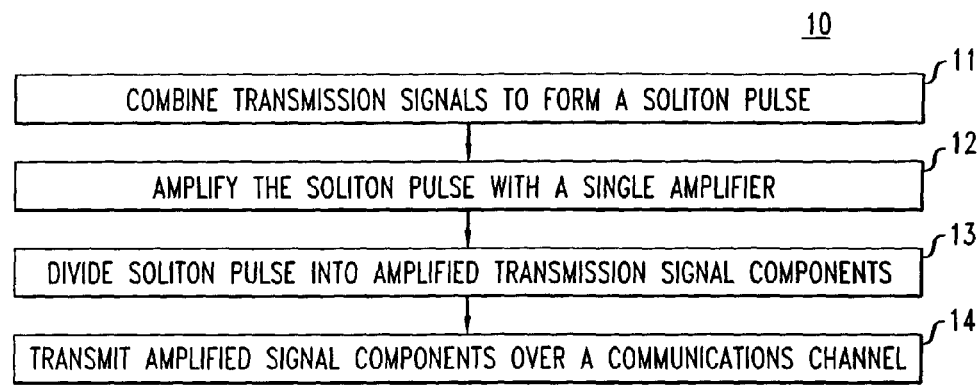
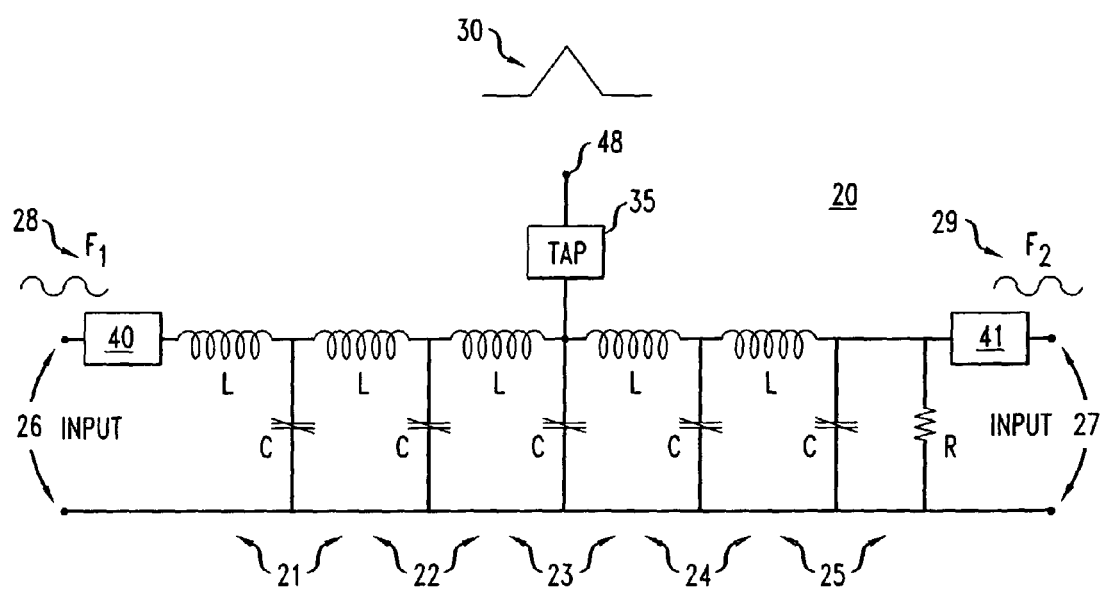

METHOD AND APPARATUS FOR MINIMIZING THE NUMBER OF POWER AMPLIFIERS REQUIRED UNDER MULTIPLE TRANSMISSION CONDITIONS

GOVERNMENT INTEREST

The invention described herein may be manufactured, used, and licensed by or for the Government for governmental purposes without the payment to us of any royalty thereon.

FIELD OF THE INVENTION

The present invention relates to the field of communications systems and, more particularly, to systems operating under multiple transmission conditions.

BACKGROUND OF THE INVENTION

Anytime a communications system is designed to transmit signals at more than one frequency (i.e. a multiple-transmission system), the designer and/or operator of the system is typically concerned with signal distortion. In some multiple-transmissions systems, a significant amount of signal distortion can be found when only one power amplifier is used to amplify all the transmitted signals. This is due to the fact that power amplifiers typically have the ability to provide distortion-free amplification for only a limited range of frequencies. Thus, if the multiple-transmission system requires the transmission of a signal having a frequency outside the distortion-free range of the power amplifier, the signal may be significantly distorted during transmission.

A solution to this problem is to design the multiple-transmission system to provide a separate power amplifier for each transmission signal. Since each amplifier may provide distortion-free amplification at the frequency of its respective signal, this solution insures that signal distortion is minimized during transmission.

Power amplifiers, however, are typically large and expensive devices that require large amounts of direct current (DC) power, and thus relatively large and expensive DC batteries, to operate. As a result, even though using separate amplifiers has been found to reduce signal distortion during transmissions, it can substantially increase the overall size and cost of the multiple-transmission systems in which it is implemented. Thus, from the above, it can be appreciated that designers of such multiple transmission systems are faced with the decision of designing a low-distortion system having a high cost—due to a large number of power amplifiers, or a high-distortion system having a low cost—due to a small number of power amplifiers.

SUMMARY OF THE INVENTION

We have realized that a low-distortion multiple-transmission system can be achieved, without the high cost of providing separate power amplifiers, by combining the transmission signals to form a so-called soliton pulse, amplifying the soliton pulse with a single amplifier, and dividing the soliton pulse back into its transmission signal components. The term soliton pulse as used herein refers to a pulse formed by combining a plurality of soliton waves, each soliton wave being a series of pulses composed of a phase-delayed portion of each transmission signal.

Amplifying the soliton pulse in accordance with the principles of the present invention has the effect of amplifying each portion of each transmission signal combined to form the soliton pulse. In addition, dividing the amplified soliton pulse in accordance with the principles of the present invention yields an amplified version of each of the original transmission signals that were combined to form the soliton pulse. Moreover, since the amplified transmission signals are obtained by using only a single amplifier, the amount of distortion produced during such amplification is substantially minimized. As a result, the present invention advantageously provides a means to reduce the number of amplifiers needed to provide low-distortion multiple-signal transmissions, and thus provides a means to reduce the overall size and cost of a multiple-transmission system, without substantially increasing signal distortion.

In particular embodiments, the soliton pulse is formed by a so-called non-linear transmission line (NTL) circuit. The term NTL circuit as used herein refers to a circuit composed of a plurality of non-linear sections, where each non-linear section has a series inductance, L, and a variable shunt capacitance, C, and where the product of L and C in a given non-linear section determines the phase velocity of a signal propagating in that section. In such embodiments, the soliton wave is obtained by inputting the plurality of transmission signals to the NTL circuit, and tapping the soliton pulse off a given non-linear section of the NTL circuit. The soliton pulse, and thus its component transmission signals can then be amplified by a conventional power amplifier with a relatively small amount of signal distortion, if any. Once amplified, the soliton pulse can then be fed into a "dividing" NTL circuit that is operable to divide the amplified soliton pulse into its component transmission signals. In such embodiments, the component transmission signals can then be fed to a common antenna for transmission over a communications channel.

These and other features of the invention will become more apparent from the Detailed Description when taken with the drawing(s). The scope of the invention, however, is limited only by the claims.

BRIEF DESCRIPTION OF THE DRAWINGS

FIG. 1 is a block diagram of an illustrative embodiment of a method for amplifying and transmitting a plurality of transmission signals, having different frequencies, in accordance with the principles of the present invention.

FIG. 2 is an illustrative embodiment of a nonlinear transmission circuit for combining a pair of transmission signals into a soliton pulse in accordance with the principles of the present invention.

DETAILED DESCRIPTION

Figure 3:
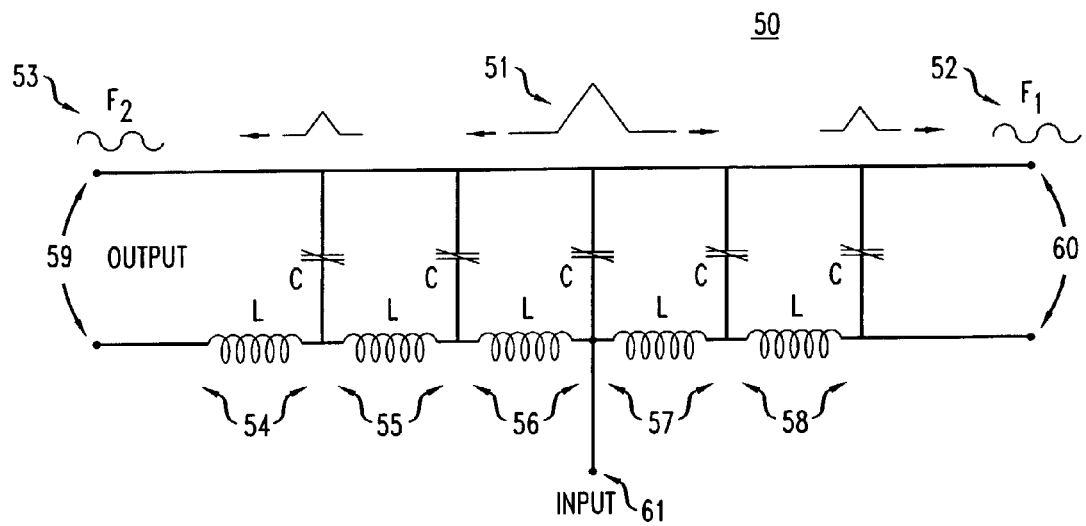
FIG. 3 is an illustrative embodiment of a nonlinear transmission circuit for dividing a soliton pulse in accordance with the principles of the present invention.

Referring now to FIG. 1 there is shown a method 10 for amplifying and transmitting a plurality of transmission signals, having different frequencies, in accordance with the principles of the present invention. As shown, method 10 begins with a combining step 11 wherein the plurality of transmission signals are combined to form a soliton pulse. The soliton pulse is then passed through a power amplifier at an amplifying step 12 to form an amplified soliton pulse. The amplified soliton pulse is then divided at a dividing step 13 into its amplified transmission signal components at their original undistorted frequencies. The amplified transmission signal components are then transmitted, at a transmission step 14, through a common antenna over a communications channel.

The soliton pulse formed at combining step 11 consists of a plurality of soliton waves, each soliton wave being a series of pulses, where each pulse is composed of a phase-delayed portion of each transmission signal. Amplifying the soliton pulse, at amplifying step 12, therefore has the effect of amplifying each portion of each transmission signal that was combined in combining step 11 to form the soliton pulse. Since only a single amplifier is needed to amplify the soliton pulse, the amount of signal distortion resulting from the amplification at amplifying step 12 is substantially minimized. Moreover, since the amplified soliton pulse is composed of amplified versions of the original transmission signals, dividing the soliton pulse at dividing step 13 yields amplified versions of the original transmission signals. Thus, in accordance with the principles of the present invention, method 10 provides a means for amplifying a plurality of transmission signals with a single amplifier, while reducing the risk of signal distortion. As a result, method 10 advantageously provides a means to reduce the overall size and cost of a multiple-transmission system.

We do not intend to limit the present invention to any particular method of combining the plurality of transmission signals, as described above. Thus, in accordance with the principles of the present invention, the plurality of transmission signals may be combined by any means that results in a soliton pulse described above. For example, in particular embodiments, the soliton pulse can be formed by feeding the plurality of transmission signals to a non-linear transmission line (NTL) circuit. The operation of NTL circuits is fully disclosed in U.S. Pat. No. 5,495,253, entitled "Soliton Rejection Filter", issued Feb. 27, 1996 to Albert et al. incorporated herein by reference. In general, transmission signals input to an NTL circuit are passed through a series of non-linear sections, each section having a series inductance, L and a variable shunt capacitance, C, where the product of L and C in a given non-linear section controls the phase velocity of the signal propagating in that section.

Referring now to FIG. 2 there is shown an illustrative embodiment of an NTL circuit 20 for combining a first transmission signal 28 having a frequency F1, and a second transmission signal 29 having a frequency F2, to form a soliton pulse 30 in accordance with the principles of the present invention. As shown, NTL circuit 20 is composed of non-linear sections 21-25, each non-linear section having series inductance L and a variable shunt capacitance C. Non-linear section 21 is coupled to an input port 26 of NTL circuit 20 through an isolator 40. Nonlinear section 25 is coupled to an input port 27 of NTL circuit 20 through resistor R and isolator 41. A signal tap 35 is coupled between non-linear section 23 and output port 48.

In operation, when first transmission signal 28 is input to input port 26 and second transmission signal 29 is input to input port 27, a soliton pulse 30 is formed at non-linear section 23. Soliton pulse 30 can be obtained at output port 48 by conventional means through signal tap 35. The conversion/combination of, for example, transmission signals 28 and 29 to form, for example, soliton pulse 30 is fully described by Kolosick et al. in "Properties of Solitary Waves as Observed on a Nonlinear Dispersive Transmission Line", published in Proceedings of the IEEE, Vol. 62, No. 5, pg. 578-581, May 1974.

As described therein, the nonlinear sections of an NTL circuit are both nonlinear and dispersive to a transmission signal, or RF sinusoidal wave. That is, the phase velocity of a sinusoidal wave (e.g. transmission signals 28 and 29) propagating in a given nonlinear section of the NTL circuit is proportional to the inverse of the square root of the series inductance, L, times the variable shunt capacitance, C, in that nonlinear section. Since the value of C in each nonlinear section of the NTL circuit changes as the amplitude of the transmission signal traveling therein changes, the phase velocity of the transmission signal will become spread out, or dispersive, over time. That is, as the transmission signal travels in the NTL circuit, the components of the transmission signal will propagate at different speeds over time. As a result, such transmission signals will become more and more dispersed as they travel through each nonlinear section of the NTL circuit.

Depending on the value of C and L in each nonlinear section of the NTL circuit, the transmission signals input to the NTL circuit will begin to look like a series of pulses with sharp discontinuities that resemble a shock wave, or what is called a soliton wave. Moreover, transmission signals input to the input ports of the NTL circuit will collide at a predetermined location (e.g. nonlinear section 23, shown in FIG. 2), and form a single soliton pulse (e.g. soliton pulse 30, shown in FIG. 2). As a result, the soliton pulse is obtained by signal-tapping (e.g. through signal tap 35, shown in FIG. 2) that predetermined location of the NTL circuit. In addition, by isolating the input ports of the NTL circuit (e.g. by isolators 40 and 41, shown in FIG. 2), the soliton waves that travel past that predetermined location are blocked from interfering with transmission signals input to the input ports of the NTL circuit.

As described above, once the soliton pulse is obtained it is amplified and then input to an NTL circuit operable to divide the soliton pulse into amplified versions of the original transmission signals input to the NTL circuit that formed the soliton pulse. It is not our intention to limit the present invention to any particular method of dividing an amplified soliton pulse into amplified versions of the original transmission signals. Thus, in accordance with the principles of the present invention, the soliton pulse may be divided by any means that results in obtaining such amplified versions of the original transmission signals. For example, in particular embodiments, the amplified versions of the original transmission signals can be obtained by inputting the soliton pulse to a "dividing" non-linear transmission line (NTL) circuit.

Referring now to FIG. 3, there is shown an illustrative embodiment of an NTL circuit 50 for dividing a soliton pulse 51 into its component amplified transmission signals 52 and 53, where amplified transmission signal 52 has a frequency F1 and amplified transmission signal 53 has a frequency F2, in accordance with the principles of the present invention. As shown, NTL circuit 50 is composed of non-linear sections 54-58, each non-linear section having series inductance, L, and a variable shunt capacitance, C. Non-linear section 54 is coupled to an output port 59 of NTL circuit 50, nonlinear section 58 is coupled to output port 60 of NTL circuit 50, and non-linear section 56 is coupled to input port 61 of NTL circuit 50.

In operation, when soliton pulse 51 is input to input port 61, amplified transmission signals 52 and 53 are formed at output ports 60 and 59, respectively. The physical conversion/dividing of soliton pulse 51 into amplified transmission signals 52 and 53 is fully described by Kolosick et al. in "Properties of Solitary Waves as Observed on a Nonlinear Dispersive Transmission Line", published in Proceedings of the IEEE, Vol. 62, No. 5, pg. 578-581, May 1974.

As described therein, an NTL circuit configured in such a manner basically behaves opposite to the behavior of an NTL configured to form a soliton pulse, as shown in FIG. 2 and described above. For example, as the soliton pulse travels into NTL circuit 50 through input port 61, it splits such that a first portion of soliton pulse 51 travels through nonlinear sections 54 and 55 to output port 59, and a second portion travels through nonlinear section 57 and 58 to output port 60. The portion that reaches output port 59 is amplified transmission signal 53, and the portion that reaches output port 60 is amplified transmission signal 52.

Figure 4:
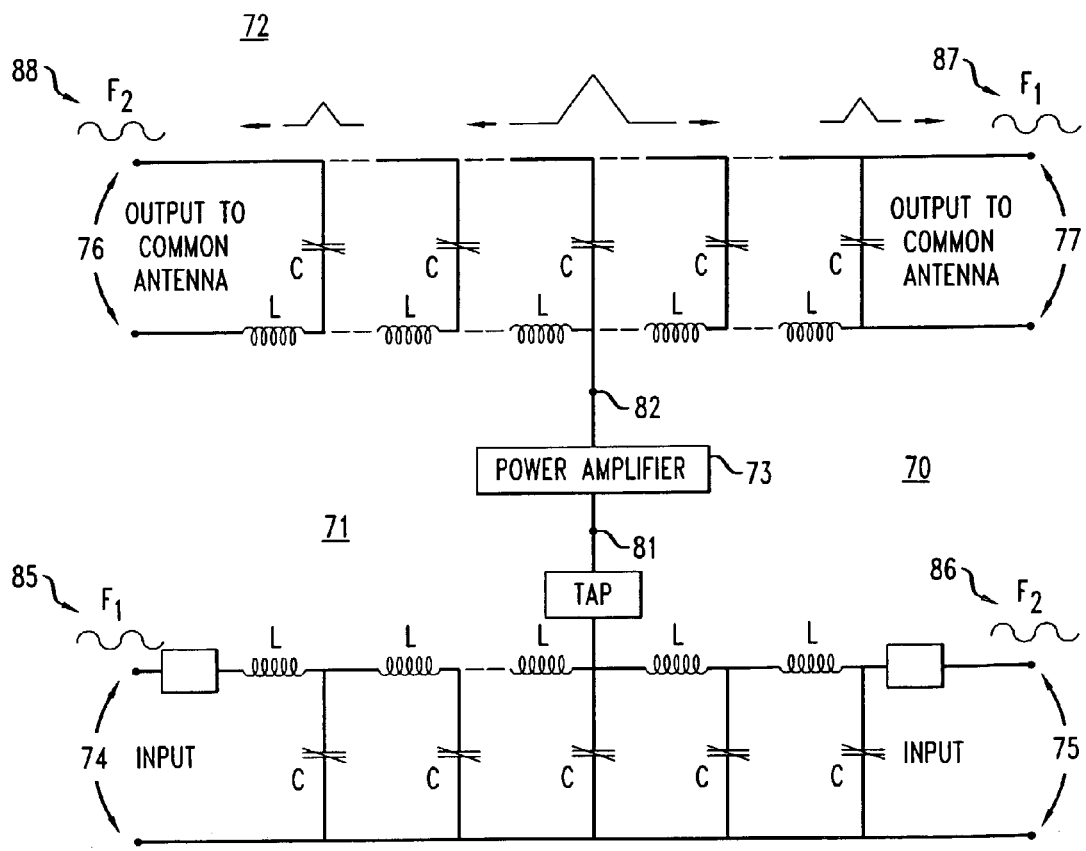
FIG. 4 is an illustrative embodiment of an apparatus for amplifying and transmitting a plurality of transmission signals, having different frequencies, in accordance with the principles of the present invention.

Referring now to FIG. 4, there is shown an illustrative embodiment of an apparatus 70 for amplifying and transmitting a plurality of transmission signals, having different frequencies, in accordance with the principles of the present invention. As shown, apparatus 70 is composed of a power amplifier 73 connected to an output port 81 of a "combining" NTL circuit 71 and an input port 82 of a dividing NTL circuit 72. Combining NTL circuit 71 has input ports 74 and 75, and dividing NTL circuit 72 has output ports 76 and 77.

Since the operation of combining NTL circuit 71 and dividing NTL circuit 72 have been fully described above in connection with FIGS. 2 and 3, respectively, it should be appreciated that feeding transmission signals 85 and 86 to input ports 74 and 75 results in the output of amplified versions 87 and 88 of transmission signals 85 and 86 from output ports 76 and 77, where the amplified versions 87 and 88 of transmission signals 85 and 86 can be fed to common antenna for transmission over a communication channel.

The terms and expressions used herein are used as terms of description and not of limitation, and there is no intention, in the use of such terms and expressions, of excluding any equivalents of the features shown and described or any portions thereof. Also, it is recognized that various modifications are possible within the scope of the invention claimed.

What is claimed is:

1. A method comprising the steps of:
   inputting a plurality of transmission signals;
   phase-delaying a portion of said plurality of transmission signals;
   forming a plurality of soliton waves;
   combining said plurality of transmission signals to form a soliton pulse, said soliton pulse being a combination of said plurality of soliton waves, each of said plurality of soliton waves being a series of pulses composed of said phase-delayed portion of each the plurality of transmission signals;
   amplifying said soliton pulse;
   dividing said amplified soliton pulse into its component transmission signals such that each component transmission signal is an amplified version of one of said plurality of transmission signals.

2. The method of claim 1 wherein said combining step further comprises the steps of:
   inputting said plurality of transmission signals to a combining non-linear transmission line (NTL) circuit, said combining NTL circuit being a circuit composed of a plurality of non-linear sections, each non-linear section comprising a series inductance, L, and a variable shunt capacitance, C, where the product of L and C in a given non-linear section determines the phase velocity of a signal propagating in that section; and
   tapping said soliton pulse off a given non-linear section of the combining NTL circuit.

3. The method of claim 2 wherein said amplifying step further comprises the step of inputting said soliton pulse into a single power amplifier.

4. The method of claim 3 wherein said dividing step further comprises the step of inputting said amplified soliton pulse into a non-linear section of a dividing NTL circuit so that said dividing NTL circuit outputs an amplified version of each of said plurality of transmission signals.

5. The method of claim 4 further comprising the step of transmitting said amplified version of each of said plurality of transmission signals over a communications channel.

6. The method of claim 5 wherein said combining NTL circuit has an isolator connected to each of its input ports.

7. The method of claim 6 wherein said dividing NTL circuit outputs said amplified versions of said plurality of transmission signals to a common antenna.

8. An apparatus comprising:
   a transmission signals input provides a plurality of transmission signals to said apparatus;
   a means for phase delay that generates a phase-delayed portion of each of said plurality of transmission signals;
   a means for producing soliton waves that produces a series of soliton waves;
   a means for combining said plurality of transmission signals to form a soliton pulse, said soliton pulse comprising said series of soliton waves, each of said series of soliton waves being a series of pulses, each of said series of pulses being composed of said phase-delayed portion of each of the transmission signals;
   an amplifier connected to said for combining means, said amplifier being operable to amplify said soliton wave such that said plurality of transmission signals which comprise said soliton pulse are amplified to generate an amplified soliton pulse; and
   a means for dividing said amplified soliton pulse into said amplified transmission signals, said dividing means being connected to said amplifier.

9. The apparatus of claim 8 wherein said combining means further comprises:
   a non-linear transmission line (NTL) circuit, said NTL circuit being a circuit composed of a plurality of non-linear sections, each non-linear section comprising a series inductance, L, and a variable shunt capacitance, C, where the product of L and C in a given non-linear section determines the phase velocity of a signal propagating in that section;
   and a means for tapping said soliton pulse from a given non-linear section of the NTL circuit.

10. The apparatus of claim 9 wherein said amplifier further comprises a single power amplifier.

11. The apparatus of claim 10 wherein said dividing means further comprises a dividing NTL circuit,
    said dividing NTL circuit comprising a plurality of non-linear sections, each non-linear section comprising a series inductance, L, and a variable shunt capacitance, C, where the product of L and C in a given non-linear section determines the phase velocity of a signal propagating in that section, an input port located at a given non-linear section of said dividing NTL circuit, and a plurality of output ports, where said input port is operable to accept said amplified soliton pulse, and where each output port is operable to output a given one of said amplified transmission signals.

12. The apparatus of claim 11 further comprising a means for transmitting said amplified versions of said plurality of transmission signals over a communications channel.

13. The apparatus of claim 12 further comprising a common antenna through which said amplified versions of said plurality of transmission signals are transmitted over said communications channel.

14. The apparatus of claim 13 wherein each input port of said combining NTL circuit further comprises an isolator for blocking interference from said transmission signals input to said combining NTL circuit.

* * * * *